United States Patent
Chen

(10) Patent No.: US 10,592,024 B2
(45) Date of Patent: Mar. 17, 2020

(54) TOUCH SCREEN

(71) Applicant: WUHAN CHINA STAR OPTOELECTRONICS SEMICONDUCTOR DISPLAY TECHNOLOGY CO., LTD., Wuhan, Hubei (CN)

(72) Inventor: Zhe Chen, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 87 days.

(21) Appl. No.: 15/572,167

(22) PCT Filed: Sep. 4, 2017

(86) PCT No.: PCT/CN2017/100349
§ 371 (c)(1),
(2) Date: Nov. 7, 2017

(87) PCT Pub. No.: WO2019/024168
PCT Pub. Date: Feb. 7, 2019

(65) Prior Publication Data
US 2019/0042034 A1    Feb. 7, 2019

(30) Foreign Application Priority Data

Aug. 2, 2017 (CN) .......................... 2017 1 0649527

(51) Int. Cl.
*G06F 3/045* (2006.01)
*G06F 3/041* (2006.01)
(Continued)

(52) U.S. Cl.
CPC ............ *G06F 3/0412* (2013.01); *G06F 3/044* (2013.01); *H01L 27/323* (2013.01); (Continued)

(58) Field of Classification Search
USPC ...... 345/173, 174, 80, 102; 257/40; 313/504
See application file for complete search history.

(56) References Cited

U.S. PATENT DOCUMENTS

2008/0246704 A1* 10/2008 Kawase .............. H01L 27/3262
                                                                    345/80
2009/0128014 A1*  5/2009 Kitazume ........... H01L 51/5237
                                                                    313/504
(Continued)

FOREIGN PATENT DOCUMENTS

CN    103984442 A    8/2014
CN    104409467 A    3/2015
(Continued)

*Primary Examiner* — Thuy N Pardo
(74) *Attorney, Agent, or Firm* — Mark M. Friedman

(57) ABSTRACT

A touch screen is provided. The touch screen includes an anode electrode layer having a plurality of anode electrodes; a first electrode layer located on the anode electrode layer and having a plurality of stripe-shaped emission electrodes spaced from each other and a plurality of stripe-shaped cathode electrodes spaced from each other; and a second electrode layer located on a sealed layer and having a plurality of stripe-shaped receiving electrodes spaced from each other. Positions of the emission electrodes correspond to positions of gap areas between organic light-emitting units.

18 Claims, 4 Drawing Sheets

(51) Int. Cl.
*H01L 27/32* (2006.01)
*H01L 51/52* (2006.01)
*G06F 3/044* (2006.01)

(52) U.S. Cl.
CPC ...... *H01L 51/5209* (2013.01); *H01L 51/5225* (2013.01); *G06F 2203/04103* (2013.01)

(56) References Cited

U.S. PATENT DOCUMENTS

| | | | |
|---|---|---|---|
| 2009/0189844 A1* | 7/2009 | Shimoji | G09G 3/342 345/102 |
| 2014/0346448 A1 | 11/2014 | You et al. | |
| 2015/0287957 A1* | 10/2015 | Yoshida | H01L 51/5036 257/40 |
| 2016/0141545 A1* | 5/2016 | Kim | G09G 3/3225 257/40 |
| 2016/0188037 A1* | 6/2016 | Choi | G06F 3/041 345/174 |
| 2016/0195957 A1* | 7/2016 | Reynolds | G06F 3/0412 345/174 |
| 2016/0195997 A1* | 7/2016 | Lee | G06F 3/0412 345/174 |
| 2016/0202793 A1* | 7/2016 | Kim | G06F 3/044 345/174 |
| 2016/0202814 A1* | 7/2016 | Lee | G06F 3/044 345/173 |
| 2016/0202817 A1* | 7/2016 | Choi | G02F 1/13338 345/174 |
| 2017/0133636 A1* | 5/2017 | Yoshida | H01L 51/5036 345/174 |
| 2017/0192566 A1 | 7/2017 | Ma | |
| 2018/0261653 A1 | 9/2018 | Ye | |
| 2018/0364847 A1 | 12/2018 | Xiong et al. | |

FOREIGN PATENT DOCUMENTS

| | | |
|---|---|---|
| CN | 105655378 A | 6/2016 |
| CN | 106802742 A | 6/2017 |

* cited by examiner

TOUCH SCREEN

FIELD OF THE INVENTION

The present disclosure relates to a field of display technology, and more particularly to a touch screen.

BACKGROUND OF THE INVENTION

With popularization of intelligent electronic products, capacitive touch screens are widely used in various electronic products, such as smart phones, tablet computers, etc. Current capacitive touch screens include a one glass solution (OGS) touch screen (panel), an on-cell touch screen (panel), and an in-cell touch screen (panel). Recently, with development toward thin and light panels, the OGS touch screen, the on-cell touch screen, and the in-cell touch screen have become widely used, where the in-cell touch screen is lighter and thinner than the OGS and on-cell touch screen, and with better light-penetration, so as to gradually become the main stream capacitive touch screen.

With development of organic light-emitting diode (OLED) display technology, active-matrix organic light-emitting diode (AMOLED) displays particularly have technical features of low power consumption and high color gamut, AMOLED has become a main developing direction for future technology. Presently, a main stream technology used in AMOLED touch panels is still the OGS touch screen. However, as shown in FIG. 1, a conventional AMOLED on-cell touch screen includes a thin film transistor (TFT) substrate 11, an organic light-emitting layer 12, a cathode electrode layer 13, a sealed layer 14, an emission electrode layer 15, an insulation layer 16, and a receiving electrode layer and a hard coat layer 18 are disposed in order on the TFT substrate 11. The TFT substrate 11 includes a base substrate, and thin film transistors and an anode electrode layer are disposed in order on the base substrate. After finishing an AMOLED process, the conventional touch screen further needs to process physical/chemical vapor depositions (PVD/CVD) and lithography/etching processes, so as to manufacture touch sensing electrodes on an AMOLED backplane. Therefore, the manufacturing process is complex, and requires manufacturing electrodes on the sealed layer twice, and uses a higher temperature during the manufacture process, so that the organic light-emitting layer may be damaged, and production yield is lowered.

Hence, it is necessary to provide a touch screen which solves problems existing in the conventional technology.

SUMMARY OF THE INVENTION

The object of the present disclosure is to provide a touch screen which can improve the production yield and lower the manufacturing cost.

For solving the above-mentioned technical problem, the present disclosure provides a touch screen, which comprises:

an anode electrode layer having a plurality of anode electrodes;
a first electrode layer located on the anode electrode layer and having a plurality of stripe-shaped emission electrodes spaced from each other and a plurality of stripe-shaped cathode electrodes spaced from each other, wherein the cathode electrodes and the emission electrodes are alternatingly disposed;
and the emission electrodes and the cathode electrodes are obtained by processing a deposition process on the first electrode layer;
a sealed layer located on the first electrode layer; and
a second electrode layer located on the sealed layer and having a plurality of stripe-shaped receiving electrodes spaced from each other;
wherein the touch screen has a plurality of organic light-emitting units, and the organic light-emitting units are disposed spacingly from each other; and
positions of the emission electrodes correspond to positions of gap areas between the organic light-emitting units.

In the touch screen of the present disclosure, a width of the cathode electrode is greater than a width of the emission electrode.

In the touch screen of the present disclosure, the touch screen further includes a metal layer; the metal layer is located under the anode electrode layer; the metal layer includes a first leading wire; the anode electrode layer further includes a first connecting portion; the cathode electrode is connected with the first leading wire through the first connecting portion; the first leading wire is configured to connect a signal input end outside of a display area; and the signal input end is configured to input a cathode electric current.

In the touch screen of the present disclosure, the touch screen further includes a metal layer; the metal layer is located under the anode electrode layer; the metal layer includes a second leading wire; the anode electrode layer further includes a second connecting portion; the emission electrode is connected with the second leading wire through the second connecting portion; and the second leading wire is configured to connect to a touch chip outside of a display area.

In the touch screen of the present disclosure, the receiving electrodes are obtained by a deposition process or a sputtering process.

In the touch screen of the present disclosure, the receiving electrode is connected with a touch chip outside of a display area through a third leading wire.

In the touch screen of the present disclosure, the emission electrode and the receiving electrode are perpendicular to one another on a projection of the first electrode layer.

In the touch screen of the present disclosure, the emission electrodes and the cathode electrodes are disposed spacingly from each other.

The present disclosure provides a touch screen, which comprises:

an anode electrode layer having a plurality of anode electrodes;
a first electrode layer located on the anode electrode layer and having a plurality of stripe-shaped emission electrodes spaced from each other and a plurality of stripe-shaped cathode electrodes spaced from each other;
a sealed layer located on the first electrode layer; and
a second electrode layer located on the sealed layer and having a plurality of stripe-shaped receiving electrodes spaced from each other;
wherein the touch screen has a plurality of organic light-emitting units, and the organic light-emitting units are disposed spacingly from each other; and
positions of the emission electrodes correspond to positions of gap areas between the organic light-emitting units.

In the touch screen of the present disclosure, the emission electrodes and the cathode electrodes are obtained by processing a deposition process on the first electrode layer.

In the touch screen of the present disclosure, the cathode electrodes and the emission electrodes are alternatingly disposed.

In the touch screen of the present disclosure, a width of the cathode electrode is greater than a width of the emission electrode.

In the touch screen of the present disclosure, the touch screen further includes a metal layer; the metal layer is located under the anode electrode layer; the metal layer includes a first leading wire; the anode electrode layer further includes a first connecting portion; the cathode electrode is connected with the first leading wire through the first connecting portion; the first leading wire is configured to connect a signal input end outside of a display area; and the signal input end is configured to input a cathode electric current.

In the touch screen of the present disclosure, the touch screen further includes a metal layer; the metal layer is located under the anode electrode layer: the metal layer includes a second leading wire; the anode electrode layer further includes a second connecting portion; the emission electrode is connected with the second leading wire through the second connecting portion; and the second leading wire is configured to connect to a touch chip outside of a display area.

In the touch screen of the present disclosure, the receiving electrodes are obtained by a deposition process or a sputtering process.

In the touch screen of the present disclosure, the receiving electrode is connected with a touch chip outside of a display area through a third leading wire.

In the touch screen of the present disclosure, the emission electrode and the receiving electrode are perpendicular to one another on a projection of the first electrode layer.

In the touch screen of the present disclosure, the emission electrodes and the cathode electrodes are disposed spacingly from each other.

In the touch screen of the present disclosure, cathode electrodes and emission electrodes are disposed in one electrode layer, and then receiving electrodes are manufactured after finish sealed layer, wherein the receiving electrode can be finished by using a deposition process or a sputtering process. Therefore, the present disclosure can simplify the manufacturing process, lower the cost, and improve the production yield.

DETAILED DESCRIPTION OF THE PREFERRED EMBODIMENTS

Figure 1:
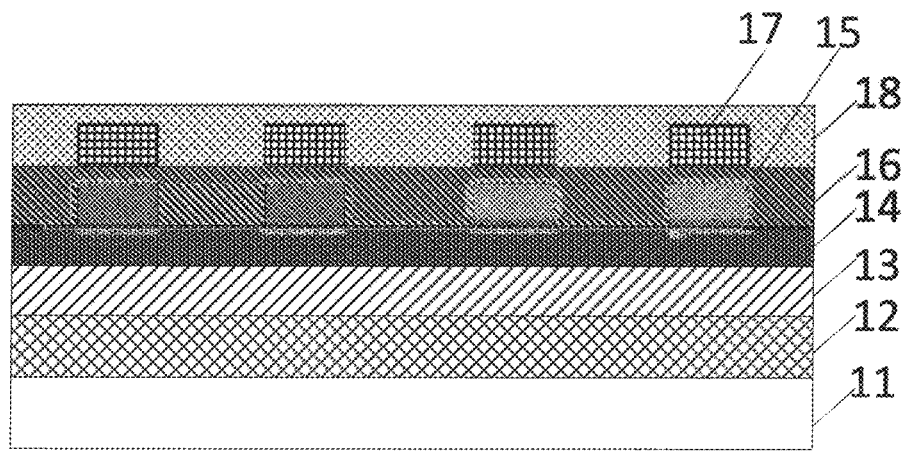
FIG. 1 is a structural schematic cross-sectional view of a conventional touch screen.

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inside, outer, side, etc., are only directions with reference to the accompanying drawings, so that the used directional terms are used to describe and understand the present invention, but the present invention is not limited thereto. In the drawings, units with similar structures use the same numerals.

Figure 2:
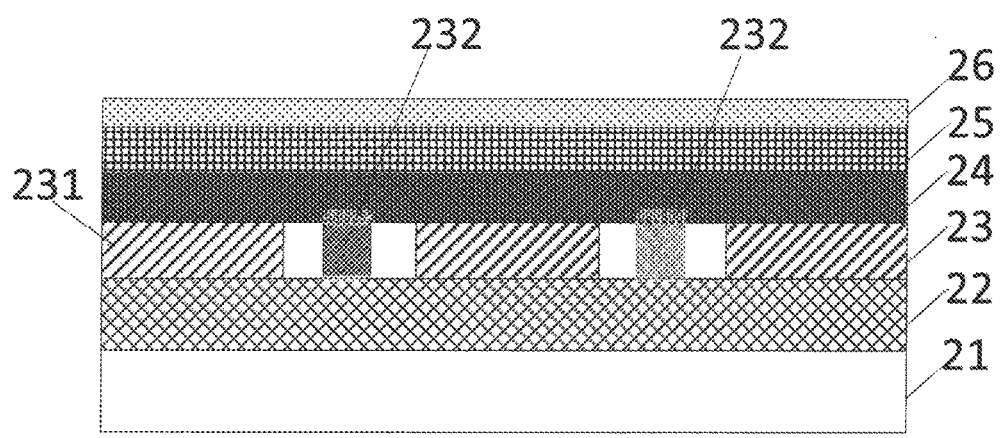
FIG. 2 is a structural schematic cross-sectional view of a touch screen of the present disclosure.

Refer now to FIGS. 2 to 7, wherein FIG. 2 is a structural schematic cross-sectional view of a touch screen of the present disclosure.

As shown in FIG. 2, the present disclosure provides a touch screen, which includes an AMOLED backplane 21, a first electrode layer 23, a sealed layer 24, and a second electrode layer 25. The AMOLED backplane 21 includes a base substrate, a switch array layer located on the base substrate, and an anode electrode layer located on the switch array layer (not shown in the figure), wherein the anode electrode layer includes a plurality of anode electrodes. The switch array layer includes an active layer, a gate insulation layer, gate electrodes, an interlayer insulation layer, source electrodes, and drain electrodes, which are disposed in order on the base substrate.

The touch screen further includes an organic light emitting layer 22 and a hard coat layer 26, wherein the organic light-emitting layer 22 is located on the anode electrode layer, and the hard coat layer 26 is located on the second electrode layer 25. The touch screen has a plurality of organic light-emitting units (not shown in the figure), and the organic light-emitting units are disposed spacingly from each other.

The first electrode layer 23 is located on the anode electrode layer. Also refer to FIGS. 3 and 4, the first electrode layer 23 includes a plurality of stripe-shaped cathode electrodes 231 spaced from each other, and a plurality of stripe-shaped emission electrodes 232 spaced from each other. That is, the cathode electrodes 231 and the emission electrodes 232 are located on the same electrode layer. The emission electrodes 232 and the cathode electrodes 231 are obtained by processing a deposition process to the first electrode layer 23. Specifically, the emission electrodes 232 and the cathode electrodes 231 are obtained by processing a deposition process on the first electrode layer 23 by using a fine metal mask. The material of the first electrode layer 23 can be a metal.

Positions of the cathode electrodes 231 correspond to positions of the organic light-emitting units. It can be understood that positions of the anode electrodes also correspond to the positions of the organic light-emitting units, and the number of the anode electrodes equal to the number of the cathode electrodes 231.

For improving light-penetration rate, positions of the emission electrodes 232 correspond to positions of gap areas between the organic light-emitting units. That is, the emission electrodes 232 correspond to the positions of the gaps between the organic light-emitting units. The emission electrodes 232 and the cathode electrodes 231 are disposed spacingly from each other. In one embodiment, the emission electrode 232 is a hybrid touch emission electrode.

For improving a display effect, in one embodiment, the emission electrodes 232 and the cathode electrodes 231 are alternatingly disposed.

For further improving the light-penetration rate and the display effect, a width of the cathode electrode 231 is greater than a width of the emission electrode 232.

The sealed layer 24 is located on the first electrode layer 23, so that the emission electrodes 232 are located inside the panel.

Figure 3:
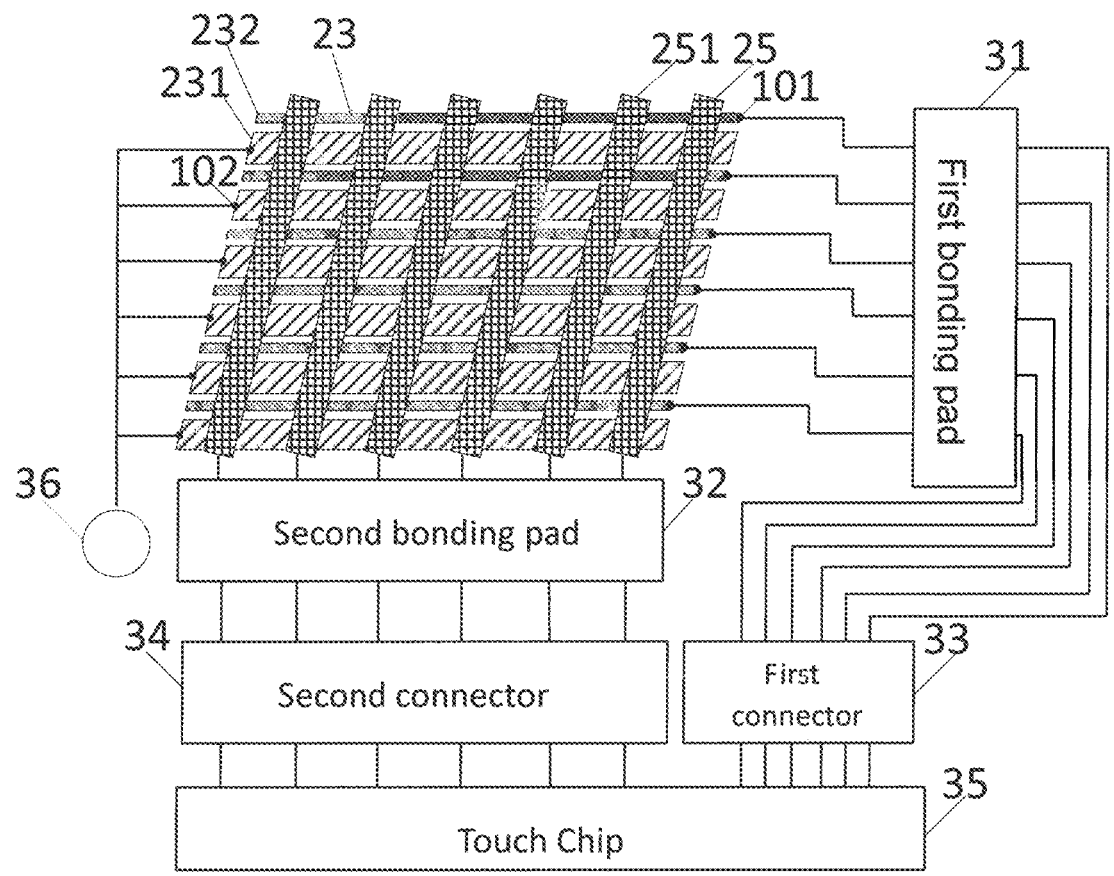
FIG. 3 is a structural schematic top view of the touch screen of the present disclosure.
Figure 4:
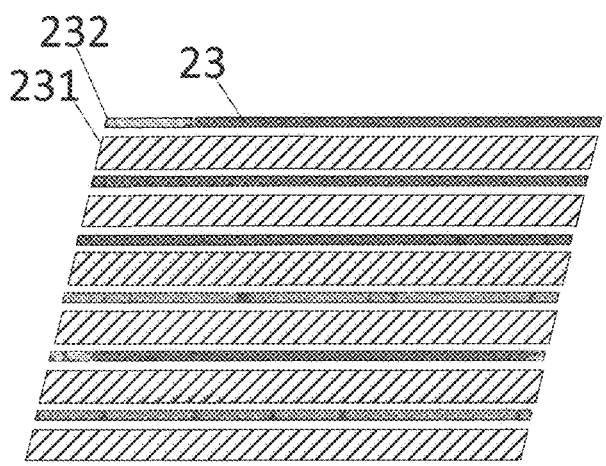
FIG. 4 is a structural schematic view of a first electrode layer of the present disclosure.
Figure 5:
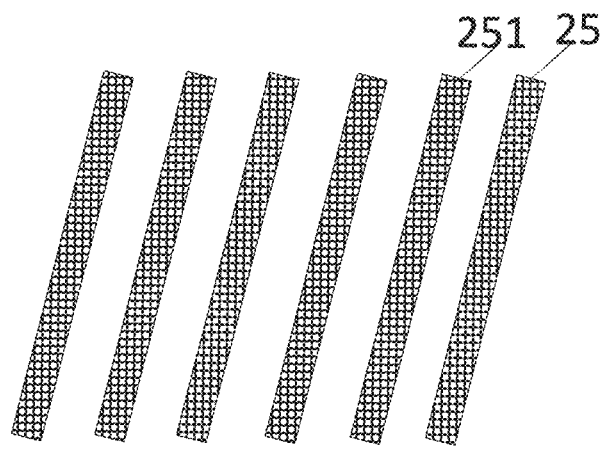
FIG. 5 is a structural schematic view of a second electrode layer of the present disclosure.

Refer now to FIGS. 3 and 5, the second electrode layer 25 is located on the sealed layer 24, and the second electrode layer 25 includes a plurality of stripe-shaped receiving electrodes 251 spaced from each other. That is, the shape of the receiving electrode 251 is a stripe. In one embodiment, the receiving electrode 251 is a hybrid touch receiving electrode. The emission electrode 232 and the receiving electrode 251 are perpendicular to one another on a projection of the first electrode layer 23. That is, the emission electrode 232 and the receiving electrode 251 are perpendicular to one another on a projection in the same plane.

The receiving electrodes 251 are obtained by a deposition process or a sputtering process. Specifically, one method to obtain a predetermined pattern of the receiving electrodes 251 is to process a deposition process to a material of the second electrode layer by using a fine metal mask; and another method to obtain a predetermined pattern of the receiving electrodes 251 is to directly sputter a material of the second electrode layer on the sealed layer by an array PVD method, and then to use a lithography process and an etching process. That is, the receiving electrode 251 is located outside the panel. Therefore, the emission electrode 232 and the receiving electrode 251, one inside the panel and another outside the panel, forms a hybrid touch screen.

Because the second method (the sputtering process) uses a higher temperature, the sealed layer may be damaged. Therefore, to improve high-temperature-resistant and corrosion-resistant for the sealed layer, and to avoid a bad influence on the organic light-emitting layer, the sealed layer can include at least one organic layer and inorganic layer, and the organic layer and the inorganic layer are alternatingly disposed.

Figure 6:
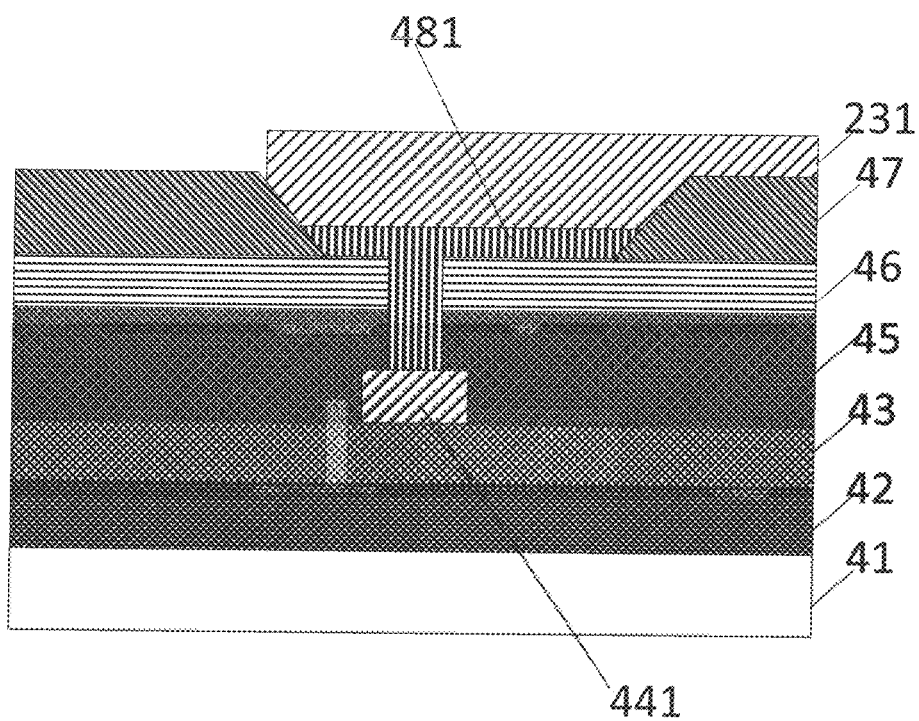
FIG. 6 is a structural schematic cross-sectional view showing a signal input area of a cathode electrode in FIG. 3.

The touch screen further includes a metal layer, and the metal layer is configured to form source electrodes and drain electrodes. FIG. 6 is a structural schematic cross-sectional view showing a signal input area 102 of a cathode electrode, wherein the structural schematic cross-sectional view is located outside of a display area. Outside of the display area, the cross-sectional structure includes a glass substrate 41, a first insulation layer 42, a second insulation layer 43, a metal layer, a third insulation layer 45, a planar layer 46, a pixel defining layer 47, an anode electrode layer, and a cathode electrode 231. The metal layer includes a first leading wire 441, namely, the first leading wire 441 and the source/drain electrodes in the display area are located in the same metal layer. The anode electrode layer further includes a first connecting portion 481, namely, the first connecting portion 481 and the anode electrode in the display area are located in the same layer.

Also refer to FIG. 3, a through hole is disposed on the pixel defining layer 47, the planar layer 46, and the third insulation layer 45, so that material of the anode electrode layer is located into the through hole to form the first connecting portion 481. The cathode electrode 231 is connected with the first leading wire 441 through the first connecting portion 481. The first leading wire 441 is configured to connect a signal input end 36 outside of the display area, and the signal input end 36 is configured to input a cathode electric current.

Figure 7:
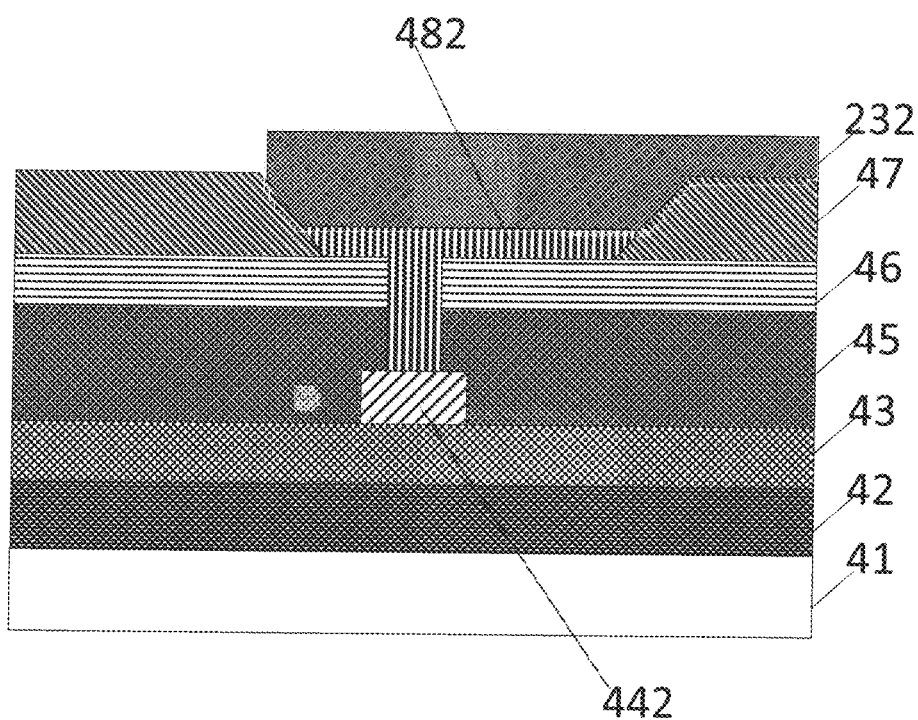
FIG. 7 is a structural schematic cross-sectional view showing a signal input area of an emission electrode in FIG. 3.

FIG. 7 is a structured schematic cross-sectional view showing a signal input area 101 of an emission electrode, wherein the structural schematic cross-sectional view is located outside of the display area. Also refer to FIGS. 3 and 6, the metal layer further includes a second leading wire 442, namely, the first leading wire 441, the second leading wire 442 and the source/drain electrodes in the display area are located in the same metal layer. The anode electrode layer further includes a second connecting portion 482, namely, the first connecting portion 481, the second connecting portion 482 and the anode electrode in the display area are located in the same layer. A through hole is disposed on the pixel defining layer 47, the planar layer 46, and the third insulation layer 45, so that material of the anode electrode layer is located into the through hole to form the second connecting portion 482.

The emission electrode 232 is connected with the second leading wire 442 through the second connecting portion 482, and the second leading wire 442 is configured to connect to a touch chip 35 outside of the display area.

Specifically, refer back to FIG. 3, the emission electrodes 232 are connected with one end of a first bonding pad 31 through the second leading wire 442, and another end of the first bonding pad 31 is connected with the touch chip 35 through a first connector 33 (Flex Printed Circuit, FPC).

The receiving electrodes 251 are connected with the touch chip 35 through a third leading wire. Specifically, the receiving electrodes 251 are connected with one end of a second bonding pad 32 through the third leading wire, and another end of the second bonding pad 32 is connected with the touch chip 35 through a second connector 34.

Compared with the manufacturing process of a conventional AMOLED on-cell touch screen, the present disclosure can obtain the cathode electrodes and the emission electrodes in one process because it separately processes one electrode layer, so it is simple and reduces costs. Furthermore, the present disclosure can be accomplished by using conventional AMOLED processes, and does not need to reconstruct machine arrangement. Moreover, because one electrode is manufactured inside the panel and another electrode is manufactured outside the panel, without a sputter process, it avoids damaging the organic light-emitting layer, and improves the production yield.

In the touch screen of the present disclosure, cathode electrodes and emission electrodes are disposed in one electrode layer, and then receiving electrodes are manufactured after finishing the sealed layer, wherein the receiving electrode can be finished by using a deposition process or a sputtering process. Therefore, the present disclosure can simplify the manufacturing process, reduce the cost, and improve the production yield.

The present disclosure has been described with preferred embodiments thereof and it is understood that many changes and modifications to the described embodiment can be carried out without departing from the scope and the spirit of the invention that is intended to be limited only by the appended claims.

What is claimed is:

1. A touch screen, comprising:
    an anode electrode layer having a plurality of anode electrodes;
    an organic light-emitting layer located on the anode electrode layer;
    a first electrode layer located on the anode electrode layer and having a plurality of stripe-shaped touch emission electrodes spaced from each other and a plurality of stripe-shaped cathode electrodes spaced from each other, wherein the cathode electrodes and the touch emission electrodes are alternately disposed on a same horizontal level; the touch emission electrodes and the cathode electrodes are obtained by a deposition process on the first electrode layer;

a sealed layer located on the first electrode layer; and a second electrode layer located on the sealed layer and having a plurality of stripe-shaped touch receiving electrodes spaced from each other;

wherein the touch screen has a plurality of organic light-emitting units, and the organic light-emitting units are disposed spacingly from each other; and positions of the emission electrodes correspond to positions of gap areas between the organic light-emitting units.

2. The touch screen according to claim 1, wherein a width of the cathode electrode is greater than a width of the touch emission electrode.

3. The touch screen according to claim 1, wherein the touch screen further includes a metal layer; the metal layer is located under the anode electrode layer; the metal layer includes a first leading wire; the anode electrode layer further includes a first connecting portion; the cathode electrode is connected with the first leading wire through the first connecting portion; the first leading wire is configured to connect a signal input end outside of a display area; and the signal input end is configured to input a cathode electric current.

4. The touch screen according to claim 1, wherein the touch screen further includes a metal layer; the metal layer is located under the anode electrode layer; the metal layer includes a second leading wire; the anode electrode layer further includes a second connecting portion; the touch emission electrode is connected with the second leading wire through the second connecting portion; and the second leading wire is configured to connect to a touch chip outside of a display area.

5. The touch screen according to claim 1, wherein the touch receiving electrodes are obtained by a deposition process or a sputtering process.

6. The touch screen according to claim 1, wherein the touch receiving electrode is connected with a touch chip outside of a display area through a third leading wire.

7. The touch screen according to claim 1, wherein the touch emission electrode and the touch receiving electrode are perpendicular to one another on a projection of the first electrode layer.

8. The touch screen according to claim 1, wherein the touch emission electrodes and the cathode electrodes are disposed spacingly from another.

9. A touch screen, comprising:

an anode electrode layer having a plurality of anode electrodes;

an organic light-emitting layer located on the anode electrode layer;

a first electrode layer located on the anode electrode layer and having a plurality of stripe-shaped touch emission electrodes spaced from each other and a plurality of stripe-shaped cathode electrodes spaced from each other, wherein the cathode electrodes and the touch emission electrodes are disposed on a same horizontal level;

a sealed layer located on the first electrode layer; and a second electrode layer located on the sealed layer and having a plurality of stripe-shaped touch receiving electrodes spaced from each other;

wherein the touch screen has a plurality of organic light-emitting units, and the organic light-emitting units are disposed spacingly from each other; and positions of the emission electrodes correspond to positions of gap areas between the organic light-emitting units.

10. The touch screen according to claim 9, wherein the touch emission electrodes and the cathode electrodes are obtained by processing a deposition process to the first electrode layer.

11. The touch screen according to claim 9, wherein the cathode electrodes and the touch emission electrodes are alternatingly disposed.

12. The touch screen according to claim 9, wherein a width of the cathode electrode is greater than a width of the touch emission electrode.

13. The touch screen according to claim 9, wherein the touch screen further includes a metal layer; the metal layer is located under the anode electrode layer; the metal layer includes a first leading wire; the anode electrode layer further includes a first connecting portion; the cathode electrode is connected with the first leading wire through the first connecting portion; the first leading wire is configured to connect a signal input end outside of a display area; and the signal input end is configured to input a cathode electric current.

14. The touch screen according to claim 9, wherein the touch screen further includes a metal layer; the metal layer is located under the anode electrode layer; the metal layer includes a second leading wire; the anode electrode layer further includes a second connecting portion; the touch emission electrode is connected with the second leading wire through the second connecting portion; and the second leading wire is configured to connect to a touch chip outside of a display area.

15. The touch screen according to claim 9, wherein the touch receiving electrodes are obtained by a deposition process or a sputtering process.

16. The touch screen according to claim 9, wherein the touch receiving electrode is connected with a touch chip outside of a display area through a third leading wire.

17. The touch screen according to claim 9, wherein the touch emission electrode and the touch receiving electrode are perpendicular to one another on a projection of the first electrode layer.

18. The touch screen according to claim 9, wherein the touch emission electrodes and the cathode electrodes are disposed spacingly from another.

* * * * *